United States Patent
Chen

(10) Patent No.: US 7,286,409 B1
(45) Date of Patent: Oct. 23, 2007

(54) METHOD AND APPARATUS TO IMPROVE NONVOLATILE MEMORY DATA RETENTION

(75) Inventor: Chung Kuang Chen, Pan Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/382,330

(22) Filed: May 9, 2006

(51) Int. Cl.
*G11C 16/28* (2006.01)
(52) U.S. Cl. .................... 365/185.2; 365/185.25; 365/222; 365/210
(58) Field of Classification Search ................ 711/106
See application file for complete search history.

(56) References Cited

U.S. PATENT DOCUMENTS

| | | | |
|---|---|---|---|
| 5,768,193 A | 6/1998 | Lee et al. | |
| 6,240,032 B1 | 5/2001 | Fukumoto | |
| 6,269,039 B1 * | 7/2001 | Glossner et al. | 365/210 |
| 6,636,440 B2 | 10/2003 | Maayan et al. | |
| 6,668,303 B2 | 12/2003 | Pio | |
| 6,731,557 B2 * | 5/2004 | Beretta | 365/222 |
| 6,754,125 B2 * | 6/2004 | Fournel et al. | 365/222 |
| 2002/0024844 A1 | 2/2002 | Saeki | |

* cited by examiner

*Primary Examiner*—Tan T. Nguyen
(74) *Attorney, Agent, or Firm*—Kenta Suzue Haynes Beffel & Wolfeld LLP

(57) ABSTRACT

Disclosed are apparatuses, methods, and manufacturing methods relating to improving data retention in nonvolatile memory. In many embodiments, reference memory corresponding to the data memory is used to determine whether to refresh the data memory.

18 Claims, 18 Drawing Sheets

METHOD AND APPARATUS TO IMPROVE NONVOLATILE MEMORY DATA RETENTION

BACKGROUND OF THE INVENTION

1. Field

The field of the technology relates to nonvolatile memory. More specifically, the technology relates to data retention in nonvolatile memory cells despite charge leakage and other factors that cause errors in data storage such as read disturbs and margin loss.

2. Description of Related Art

Storage density in nonvolatile memory cells is increased by utilizing a multi-level threshold voltage algorithm, which typically encodes at least two bits per nonvolatile memory cell. In the case of charge trapping memory cells, nanocrystal memory cells, and other memory cells with localized charge structures, each localized charge portion encodes at least two bits per cell in a multi-level threshold voltage algorithm.

However, such multi-level threshold voltage algorithms require many distinct threshold voltage states. For example, a 2-bit scheme requires four threshold voltage states, a 3-bit scheme requires eight threshold voltage states, an so on. To squeeze this many threshold voltage states within the permitted range of threshold voltages of the nonvolatile memory cell, the margin between neighboring threshold voltage states may be narrowed as a result of bunching distinct threshold voltage states closer together. However, such a threshold voltage algorithm is more vulnerable to data errors due to charge leakage, margin loss, and disturbs.

FIG. 1 shows an example threshold voltage design algorithm for a nonvolatile memory cell. FIG. 1 shows: the 0.8 V initial distribution of a low threshold voltage state 110, the 0.4 V cycling margin 120, the room temperature and read disturb 0.15 V 130, the 0.7 V final threshold voltage window 140, the 0.7 V charge loss margin 150, and the 0.7 V distribution of a high threshold voltage state 160. The table below shows the threshold voltages corresponding to different points along the voltage axis.

|     | Margin Mode 15 μA | Target Device 1 μA Vth |
| --- | --- | --- |
| 111 | 3.05 V | 1.90 V |
| 115 | 3.45 V | 2.3 V |
| 125 | 3.85 V | 2.7 V |
| 135 | 4.0 V | 2.85 V |
| 145 | 4.7 V | 3.55 V |
| 155 | 5.4 V | 4.25 V |
| 165 | 6.1 V | 4.95 V |

Therefore, it would be desirable to bunch together distinct threshold voltage states more closely together, without increasing the risk of data storage errors from confusing neighboring threshold voltage states.

SUMMARY OF THE INVENTION

One aspect of the technology is directed to a nonvolatile memory integrated circuit, comprising nonvolatile memory cells, comparison memory cells, sense amplifier circuitry, and control circuitry.

The nonvolatile memory cells include data cells and margin detection cells. The data cells are arranged into data groups. In some embodiments, the data groups are determined by word lines controlling particular nonvolatile memory cells. The data cells have a first operating margin. In some embodiments, the data cells have a charge loss margin of less than 0.7 V, a charge loss margin of about 0.2 V, a cycling margin of less than 0.4 V, and are multi-level cells with more than two logical levels.

The margin detection cells have a second operating margin narrower than the first operating margin, and store default data. Each data group of the data cells has at least one corresponding margin detection cell. The comparison memory cells store default data.

In some embodiments, the first operating margin of the data cells and the second operating margin of the margin detection cells have different effects on the corresponding sensing windows. In one embodiment, the data cells have a first sensing window corresponding to the first operating margin, the margin detection cells have a second sensing window corresponding to the second operating margin, and the first sensing window and the second sensing window are determined by setting different targets of threshold voltage for the margin detection cells and the data cells. In another embodiment, the sensing window of the margin detection cells includes 1) a first window between current representing a high threshold voltage cell and a sensing reference current and 2) a second window between current representing a low threshold voltage cell and the sensing reference current.

The sense amplifiers sense the data cells and the margin detection cells. In some embodiments, a single set of sense amplifiers is shared by the data cells and the margin detection cells. In other embodiments, different sets of sense amplifiers are dedicated to the data cells and to the margin detection cells.

The control circuitry responds to a memory user mode command by applying bias arrangements to the data cells and the margin detection cells. The bias arrangements are applied to: 1) at least one data cell of at least one data group of the data cells, 2) at least one corresponding margin detection cell of the data group (storing the default data), and 3) at least one of the comparison memory cells (storing the default data). The control circuitry refreshes at least part of a data group of the data cells, in response to a failure by the corresponding margin detection cell to agree with the comparison memory cell. In various embodiments, this failure is a threshold voltage of the corresponding margin detection cell falling outside the second operating margin, charge loss from the corresponding margin detection cell, and charge gain in the corresponding margin detection cell.

Some embodiments include an externally accessible contact of the integrated circuit having an output state indicating that the integrated circuit is busy. Other embodiments include a first externally accessible contact of the integrated circuit indicating whether the integrated circuit is busy determining a need to refresh, and a second externally accessible contact of the integrated circuit indicating whether the integrated circuit is ready for a new command or refreshing.

Another aspect of the technology is directed to a method of operating nonvolatile memory, comprising:

The step of storing default data in: a comparison memory and a nonvolatile margin detection cell corresponding to a nonvolatile data cell. The nonvolatile data cell has a first operating margin and the nonvolatile margin detection cell has a second operating margin narrower than the first operating margin.

The step of responsive to a memory user mode command, performing:

The substep of applying bias arrangements to: 1) at least one nonvolatile data cell, 2) at least one nonvolatile margin detection cell;

The substep of comparing the default data from the comparison memory and at least one nonvolatile margin detection cell; and The substep of if the default data from the comparison memory fails to agree with the data from the nonvolatile margin detection cell, then refreshing the nonvolatile data cell.

In various embodiments, responsive to the memory user mode command, the nonvolatile data cell and the nonvolatile margin detection cell are sensed in parallel with a data sense amplifier and a margin detection sense amplifier.

In other embodiments, responsive to the memory user mode command, the nonvolatile data cell and the nonvolatile margin detection cell are sensed in series with a data sense amplifier.

DETAILED DESCRIPTION

Figure 1:
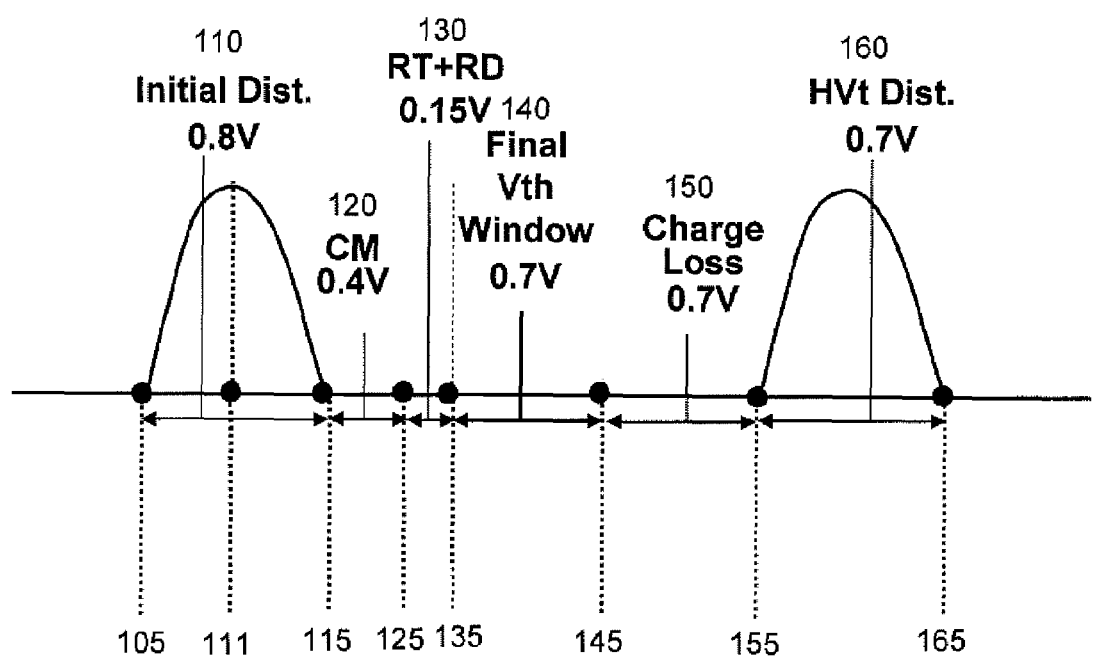
FIG. 1 shows a threshold voltage design distribution for a nonvolatile memory cell, where CM is cycling margin, RT is room temperature drift, and RD is read disturb.

FIG. 1 shows a plot of a nonvolatile memory cell threshold voltage distribution. 105 is initial threshold voltage low bound. 110 is the initial distribution window. 111 is the middle value of the initial threshold voltage. 1115 is the initial threshold voltage high bound. 120 is the low threshold voltage cycling margin. 130 is the threshold voltage room temperature drift and read disturb. 140 is the circuit read window and array cell final threshold voltage window. 150 is the charge loss window. 155 is the high threshold voltage distribution low bound. 160 is the threshold voltage of the programmed cells. 165 is the high threshold voltage distribution high bound.

Figure 2:
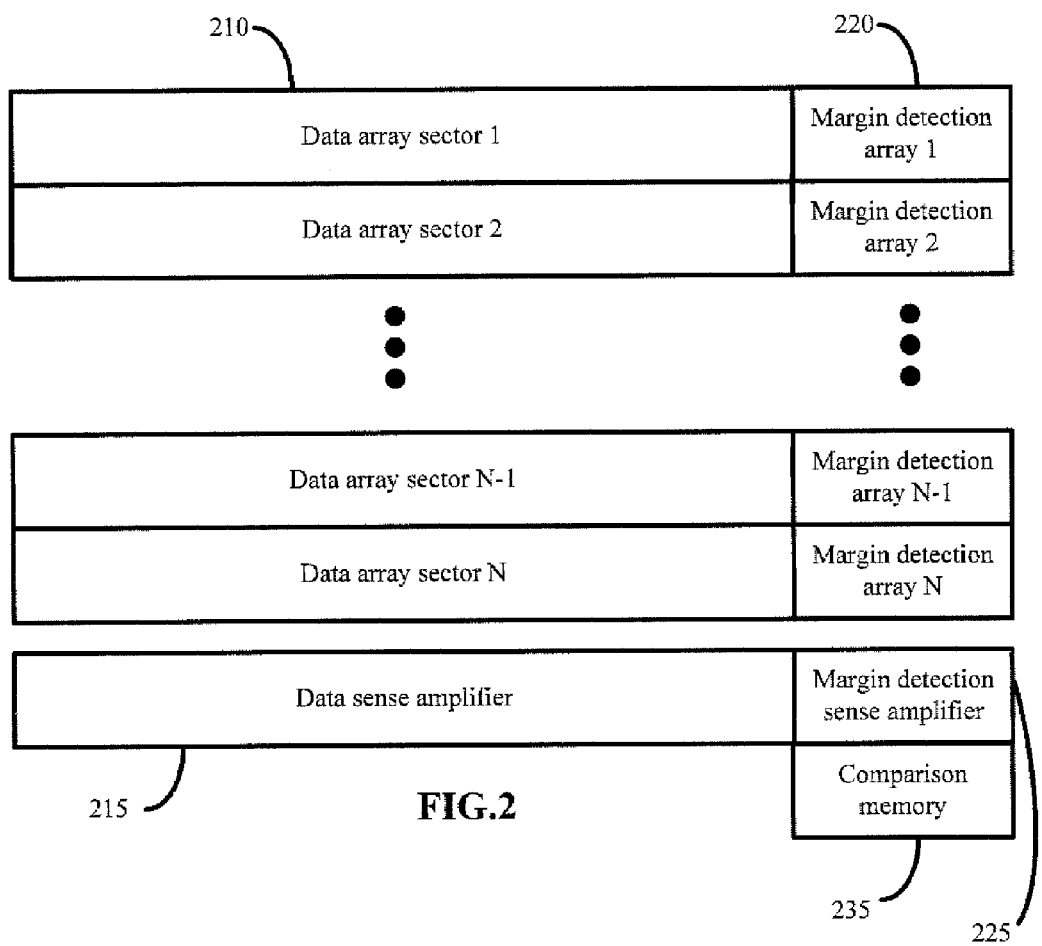
FIG. 2 shows a schematic of nonvolatile memory cells separated into a data memory portion and a margin detection memory portion, whose contents are determined respectively by a data sense amplifier portion and a margin detection sense amplifier portion; the margin detection data from the margin detection memory is compared with the default data in a comparison memory.

FIG. 2 shows a schematic of nonvolatile memory cells separated into a data memory portion and a margin detection memory portion, whose contents are determined respectively by a data sense amplifier portion and a margin detection sense amplifier portion. The data memory portion of nonvolatile memory cells includes data sectors 1 to N 210. The contents of this data portion of nonvolatile memory cells is read by the data sense amplifier portion 215. The margin detection memory portion of nonvolatile memory cells 220 includes multiple parts that each correspond to different data memory sectors 1 to N 210. In this way, each data memory sector has at least one corresponding margin detection memory cell. Each sector of data memory includes multiple rows of memory cells separately accessible by word lines. In one embodiment, each word line of memory cells has at least one corresponding margin detection memory cell. The contents of the margin detection memory portion of nonvolatile memory cells is read by the margin detection sense amplifier portion 225. Thus, the contents of a particular part of the data memory portion 210 can be read in parallel with the contents of the corresponding part of the margin detection memory portion 220. Then the sensed contents of the margin detection memory portion 220 are compared with the default contents of the comparison block 235. If the comparison fails, then the corresponding data cell block needs to be refreshed. The margin detection array data can be compared with the default values by storing at least one of these values from the margin detection array in the comparison block 235 which includes comparison memory and comparison circuitry.

Figure 3:
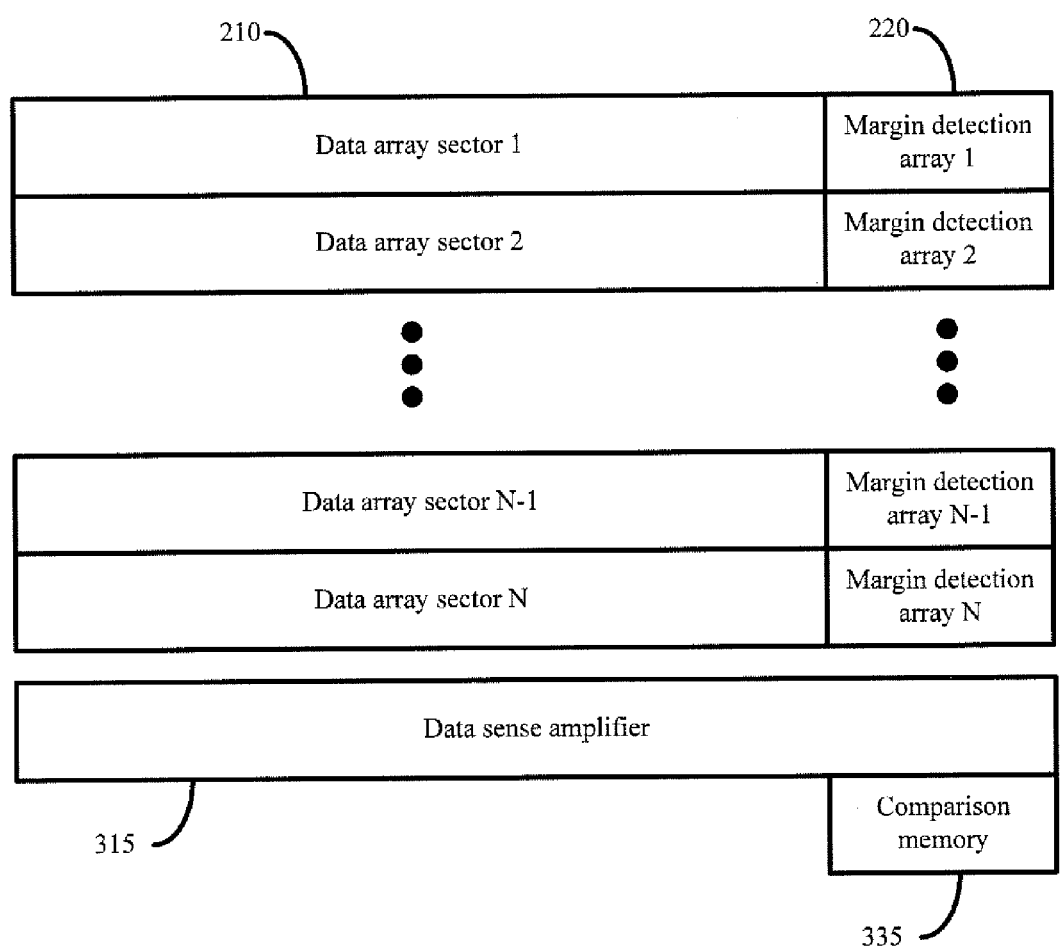
FIG. 3 shows a schematic of nonvolatile memory cells separated into a data memory portion and a margin detection memory portion, whose contents are determined by a sense amplifier portion; the margin detection data from the margin detection memory is compared with default data in a comparison memory.

FIG. 3 shows a schematic of memory cells separated into a data memory portion and a margin detection memory portion, whose contents are determined by a sense amplifier portion. Then the sensed contents of the margin detection memory portion are compared with the default contents of the comparison memory 335. FIG. 3 resembles the memory cell schematic of FIG. 2. However, the sense amplifier portion 315 is used by both the data memory portion of nonvolatile memory cells including data sectors 1 to N 210 and the margin detection memory portion of nonvolatile memory cells 220 including multiple parts that each correspond to different data memory sectors 1 to N 210. Thus, the contents of a particular part of the data memory portion 210 can be read in series with the contents of the corresponding part of the margin detection memory portion 220. The data sensed from the margin detection array can be compared with the default values in the comparison block 235.

Figure 4:
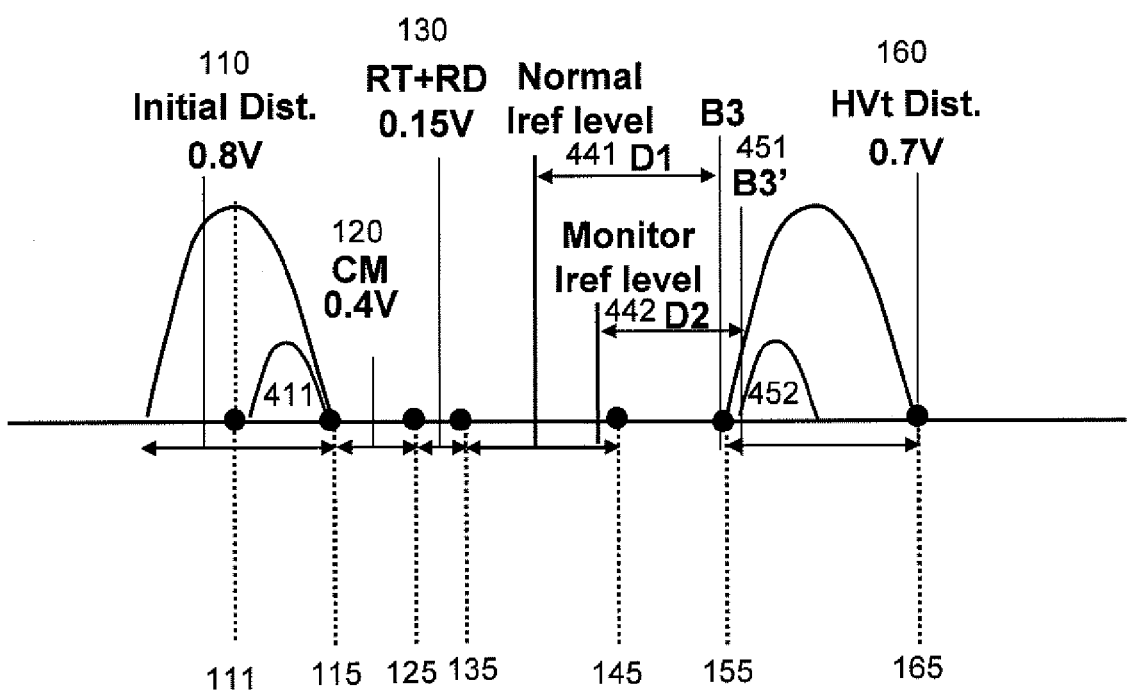
FIG. 4 shows a threshold voltage design algorithm for a nonvolatile memory cell with narrower charge loss margin by using both the normal Iref and the monitor Iref.

FIG. 4 shows a threshold voltage design algorithm for a nonvolatile memory cell with narrower charge loss margin than the threshold voltage design algorithm of FIG. 1. 155 is the low bound of the threshold voltage distribution of the data array. 411 is the margin detection cell initial distribution. 441 is the data cells cycling margin, D1. 442 is the margin detection cells cycling margin, D2. 451 is the low bound of the threshold voltage distribution. 452 is the high threshold voltage distribution of the margin detection array. The narrower threshold voltage distributions 411 and 452 correspond to the low threshold voltage state and high threshold voltage state, respectively, of the margin detection cells. The data cell high threshold voltage state corresponds to a normal reference current level and a wider charge loss margin 441. The low bound of margin detection cell high threshold voltage state 452 corresponds to a monitor current reference level 442. Because the margin detection high threshold voltage state 452 has a narrower window than the normal current reference level 441, a failure to retain charge in the corresponding margin detection cell is detected sooner than in the data cell. The narrower margin corresponding to the margin detection cell therefore controls the refresh time of the data memory cell. The table below shows the threshold voltages corresponding to different points along the voltage axis. According to this algorithm, a data cell doesn't need to keep a large charge loss margin for a long time. With the algorithm, the data cell can keep a smaller cycling margin and improve the nonvolatile memory cell operating window. Monitor_Iref_2 level can be tuned to monitor the C.M. & R.T.+R.D. window, to narrow this window, and improve the operating window. The refresh action includes program and erase functions that are dependent on if the programmed cell undergoes charge loss and the erased cell undergoes charge gain.

|  | Margin Mode 15 μA | Target Device 1 μA Vth |
|---|---|---|
| 111 | 3.05 V | 1.90 V |
| 115 | 3.45 V | 2.3 V |
| 125 | 3.85 V | 2.7 V |
| 135 | 4.0 V | 2.85 V |
| 145 | 4.7 V | 3.55 V |
| 155 | 4.9 V | 3.75 V |
| 165 | 5.6 V | 4.45 V |

Figure 5:
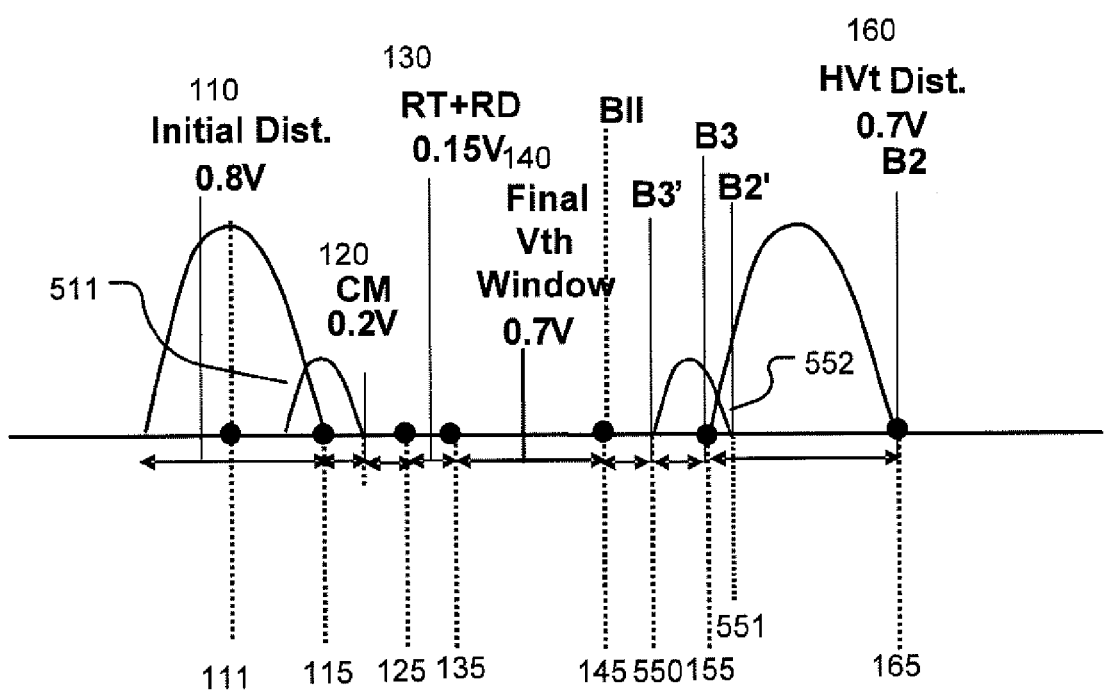
FIG. 5 shows another threshold voltage design algorithm for a nonvolatile memory cell with narrower charge loss margin which controls the boundary of the high threshold voltage distribution and the boundary of the low threshold voltage distribution of the margin detection array.

FIG. 5 shows another threshold voltage design algorithm for a nonvolatile memory cell with narrower cycling margin and charge loss margin. The narrower threshold voltage distributions 511 and 552 correspond to the low threshold voltage state and high threshold voltage state, respectively, of the margin detection cells. The data cell high threshold voltage state is programmed to a threshold voltage level B3 155. The margin detection cell high threshold voltage level is B3' 550. There is a narrower margin between the margin detection cell high threshold voltage level B3' 550 and the high bound of the final threshold voltage window B2' 551. There is a wider margin between the data cell high threshold voltage level B3 155 and the upper end of the final threshold voltage window B2 165. Thus, a failure to retain charge in the corresponding reference cell is detected sooner than in the data cell. The narrower margin corresponding to the margin detection cell therefore controls the refresh time of the data memory cell. The table below shows the threshold voltages corresponding to different points along the voltage axis. According to this algorithm, a data cell doesn't need to keep a large charge loss margin for a long time. With the algorithm, the data cell can keep a smaller cycling margin and improve the nonvolatile memory cell operating window. The threshold voltage state 511 can also be tuned to monitor the C.M. & R.T.+R.D. window, to narrow this window and improve the operating window.

|  | Margin Mode 15 μA | Target Device 1 μA Vth |
|---|---|---|
| 111 | 3.05 V | 1.90 V |
| 115 | 3.45 V | 2.3 V |
| 125 | 3.85 V | 2.7 V |
| 135 | 4.0 V | 2.85 V |
| 145 | 4.7 V | 3.55 V |
| 550 | 4.8 V | 3.65 V |
| 155 | 4.9 V | 3.75 V |
| 165 | 5.6 V | 4.45 V |

Figure 6:
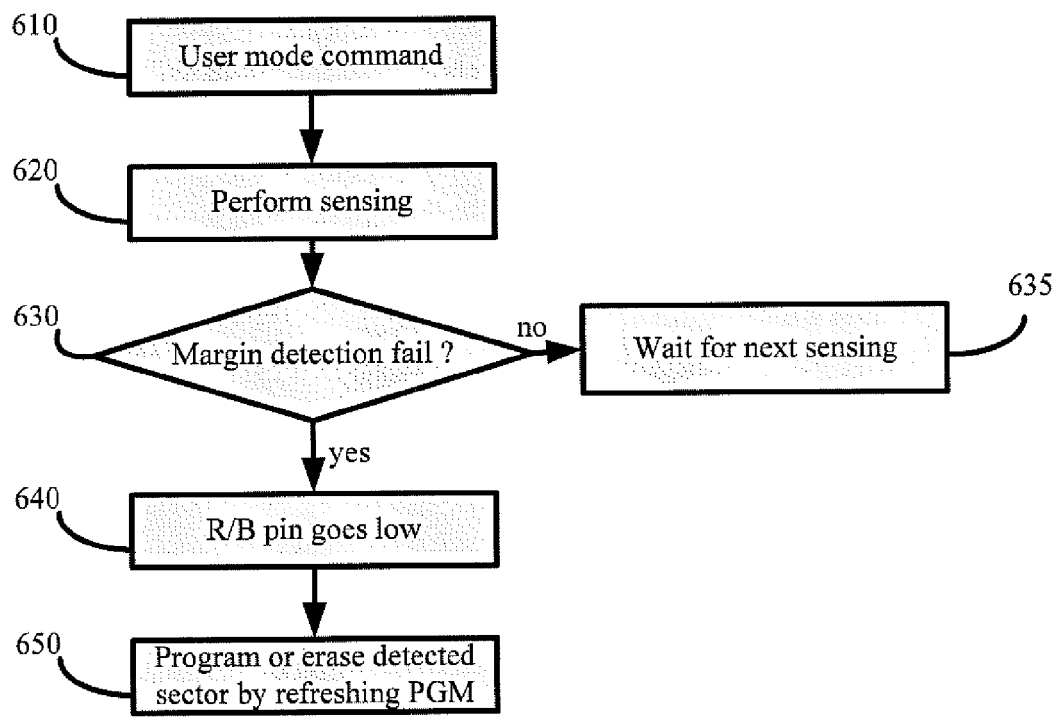
FIG. 6 shows a process flow of controlling the output of the RIB pin to indicate the status of the refresh function.

FIG. 6 shows a process flow of controlling the output of the R/B pin to indicate the status of the refresh function. In 610, a user mode command is received, such as read, program, erase, read ID, etc. In 620, the sensing action is performed. In 630, it is determined from the sense amplifier result whether the refresh cycling margin failed because of the narrow operating margin If there is no failure, then the next sensing operation is awaited. If there is a failure, then in 640 the ready/busy pin goes low. Thus, a state machine controls the ready/busy pin in response to the error determined. Finally in 650 the data cells corresponding to the failure are refreshed.

Figure 7:
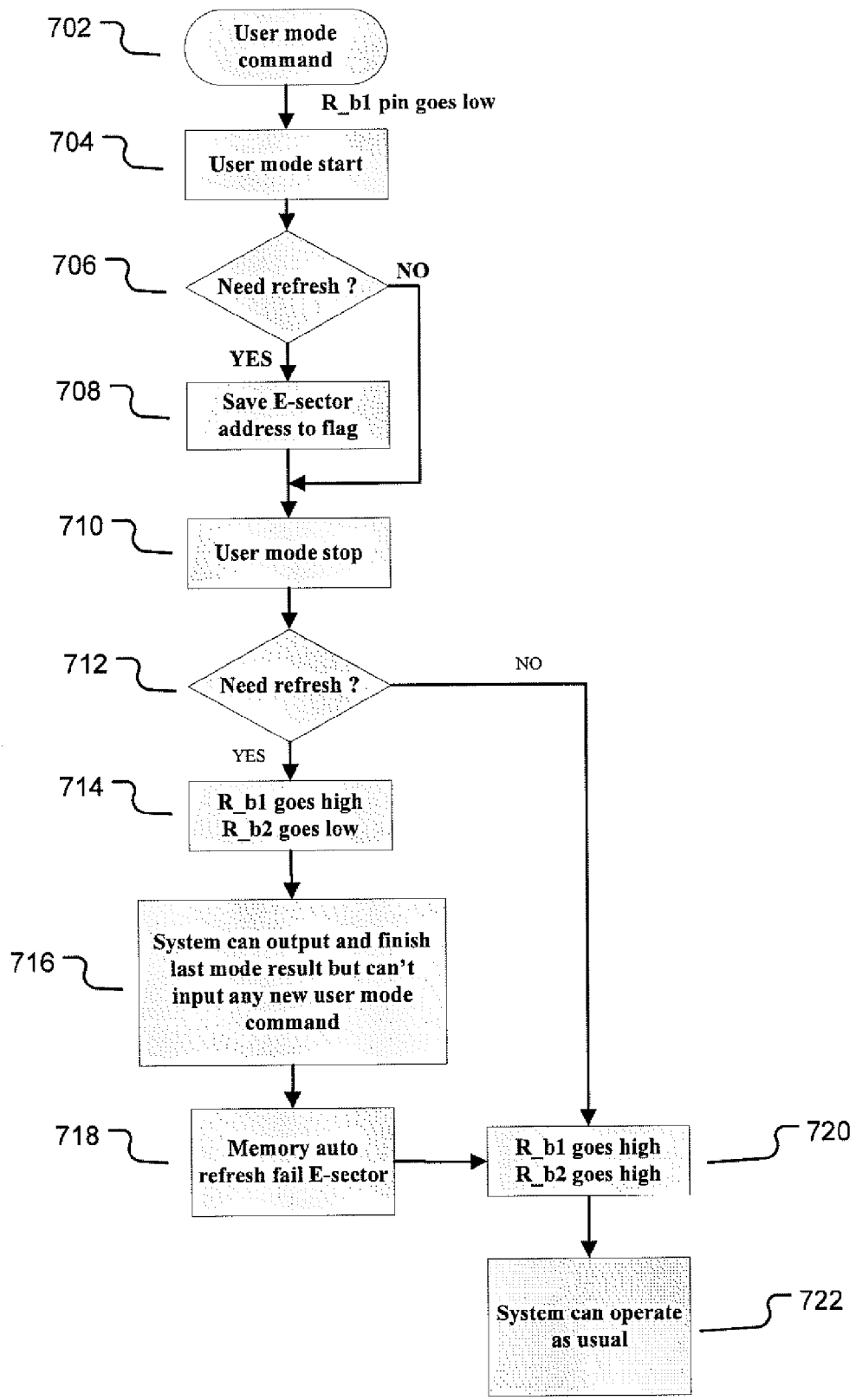
FIG. 7 shows a process flow of controlling the output of multiple R/B pins to indicate the status of the refresh function.

FIG. 7 shows a process flow of controlling the output of multiple R/B pins to indicate the status of the refresh function. This process builds up the refresh function in memory. In 702, a user mode command is received, such as to program a particular data memory cell. Pin R_b1 goes low. In 704, user mode starts. In 706, it is determined whether the data memory cells needs to be refreshed. If yes, then the process continues in 708 and the sector address is saved. If no, user mode stops in 710. Similarly, after 708, the process continues to in 710 and user mode stops. In 712, depending on whether refresh was needed. If refresh was not needed, the process ends in 720, pin R_b1 and R_b2 go high. If refresh was needed, the process continues to 714. In 714, pin R_b1 goes high, and pin R_b2 goes low. In 716, the system outputs and finishes the last mode result, but can't input any new user command, without first refreshing. In 718, the memory is refreshed, as located by the sector address saved in 708. The process ends in 720, and both pin R_b1 and pin R_b2 go high. The following truth table shows the memory status directed by the two pins R_b1 and R_b2.

|  | R_b1 | R_b2 |
| --- | --- | --- |
| Ready | 1 | 1 |
| Busy | 0 | X |
| Refresh | 1 | 0 |

Figure 8:
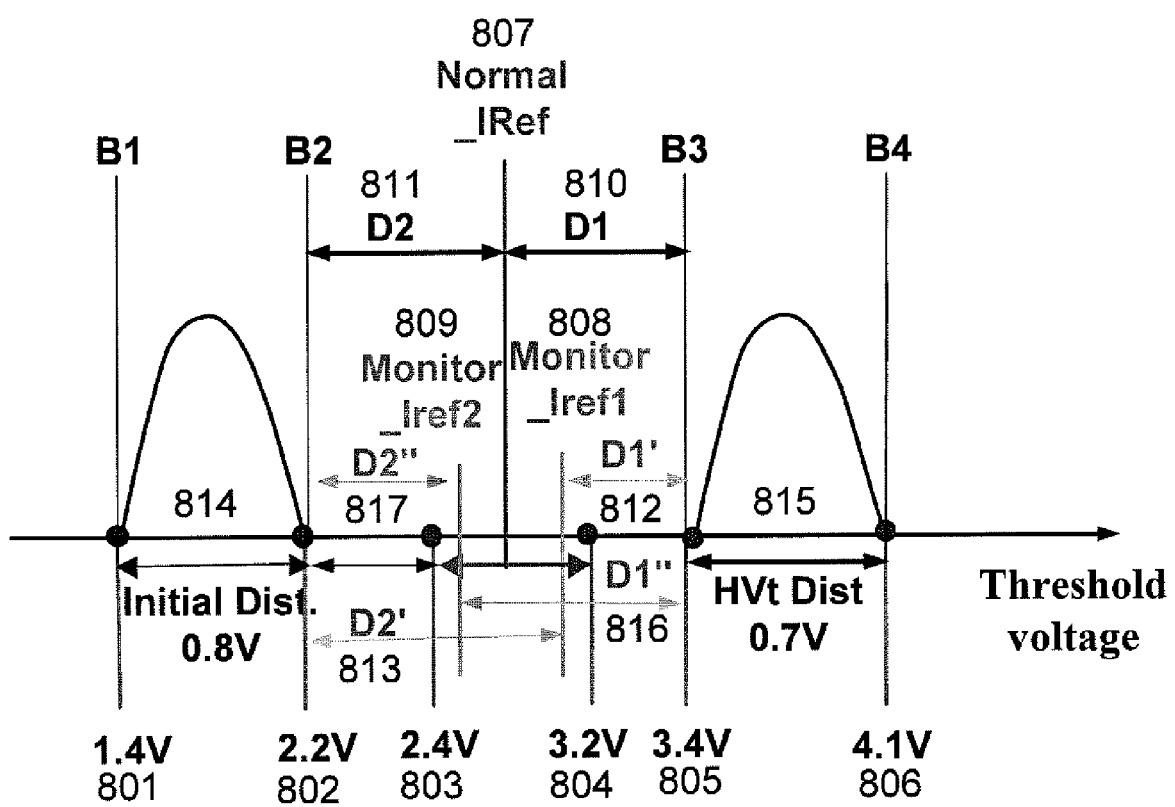
FIG. 8 shows a threshold voltage distribution for non-volatile memory cells with narrower charge loss margin and narrower CM+RT+RD margin by using the normal_Iref, monitor_Iref1 and monitor_Iref2 without extra margin detection memory.

FIG. 8 shows a threshold voltage distribution of memory cells. 801 is the low bound of the low threshold voltage distribution B1. 802 is the high bound of the low threshold voltage distribution B2. 805 is the low bound of the high threshold voltage distribution B3. 806 is the high bound of the high threshold voltage distribution B4. A normal sense amplifier will sense the memory data by using a normal_Iref 807 and have a margin D1810 for charge loss of high threshold voltage cells and margin D2 811 for charge gain of low threshold voltage cells. Without the refreshing, the memory needs to leave a large window so memory cells can have charge loss or charge gain, for example after 10K cycles and 10 years. This design suffers very seriously from a wide circuit sensing window, especially for multi-levels in one cell. So memory sensing with added monitor_Iref1 808 and monitor_Iref2 809 can narrow the threshold voltage margin of the memory cell. For example, monitor_Iref1 808 has a narrower sensing margin D1' 812 compared to D1 810 and a wider sensing margin D2' 813 compared to D2 811, so monitor_Iref1 has a smaller sensing window for high threshold voltage cells and a larger sensing window for low threshold voltage cells. Because a high threshold voltage cell fails more easily than a low threshold voltage cell with monitor_Iref1, monitor_Iref1 is used to detect the high threshold voltage margin. After the high threshold voltage of memory cells have some charge loss, the sensing with monitor_Iref1 fails, but the sensing with normal_Iref still passes. If the logic data sensed by normal_Iref is a high threshold voltage, the logic data from sensing with normal_Iref is compared with the first logic data from sensing with monitor_Iref1. If this comparison results in a mismatch, then the memory knows that this memory block of this memory cell needs to perform refreshing. Similarly, monitor_Iref2 809 has a wider sensing margin D1" 816 compared to D1810 and a narrower sensing margin D2" 817 compared to D2, so monitor_Iref has a smaller sensing window for low threshold voltage cells and a larger sensing window for high threshold voltage cells. Because a low threshold voltage cell fails more easily than a high threshold voltage cell with monitor_Iref2, monitor_Iref2 is used to detect the low threshold voltage margin. After the low threshold voltage of memory cells have charge gain, the sensing with monitor_Iref2 fails, but the sensing with normal_Iref still passes. If the logic data sensed by normal_Iref is a low threshold voltage, the logic data from sensing with normal_Iref is compared with the second logic data from sensing with monitor_Iref2. If this comparison results in a mismatch, then the memory knows that this memory block of this memory cell needs to perform refreshing. Monitor_Iref1 and monitor_Iref2 can be used separately or at the same time. For example: if the data-'1' then compare with the first logic data, if the data='0' then compare with the second logic data. The description described charge loss from high threshold voltage cells and charge gain in low threshold voltage cells. Another embodiment has charge loss from low threshold voltage cells and charge gain to high threshold voltage cells.

Figure 9A:
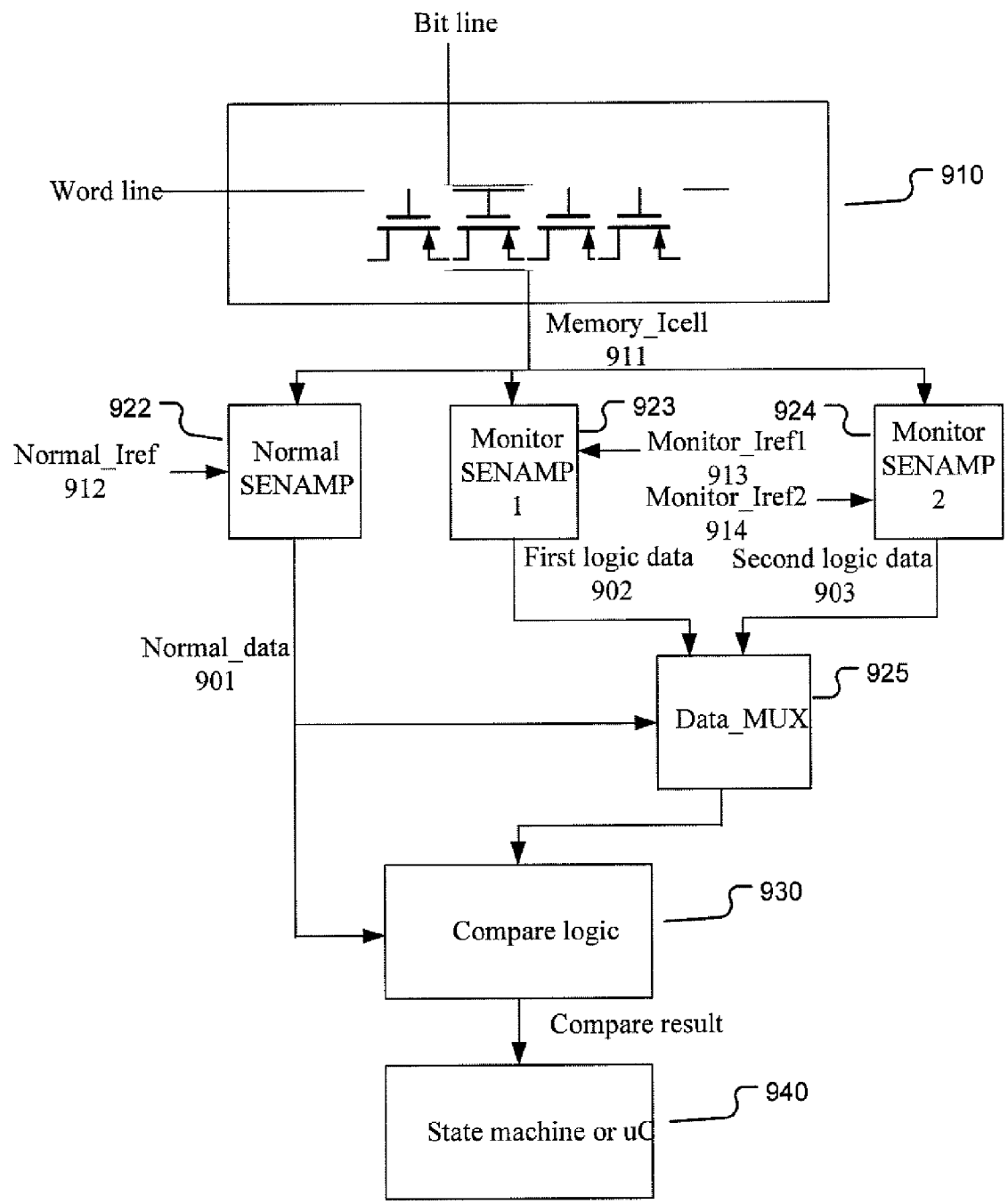
FIG. 9A shows a process flow of performing parallel sensing to determine whether to perform the refresh function with both normal sense amplifier and monitor sense amplifier with first and second monitor reference currents, that implements FIG. 8.
Figure 9B:
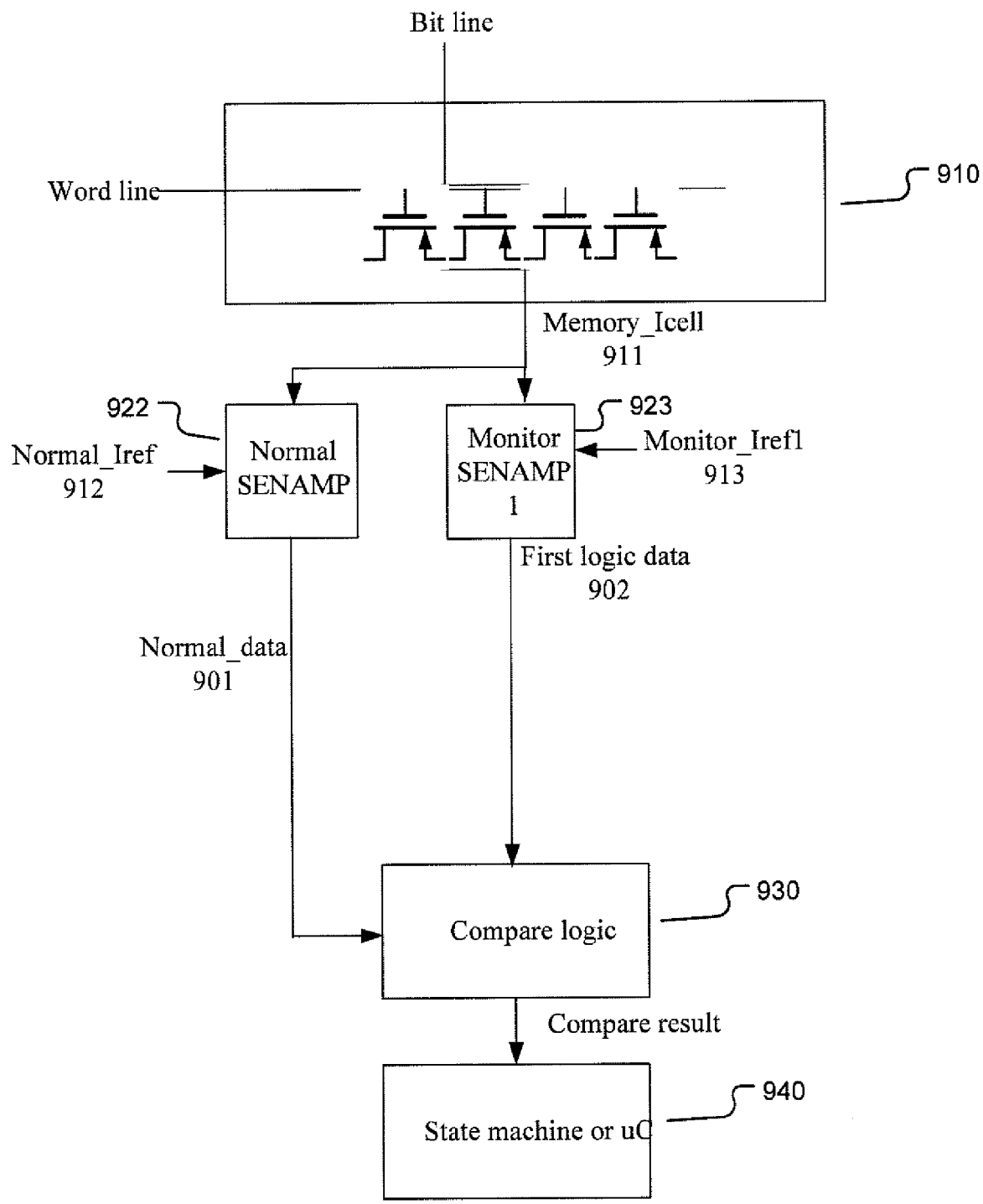
FIG. 9B shows a process flow of performing parallel sensing similar to FIG. 9A, but uses the first monitor reference current without using the second monitor reference current.
Figure 9C:
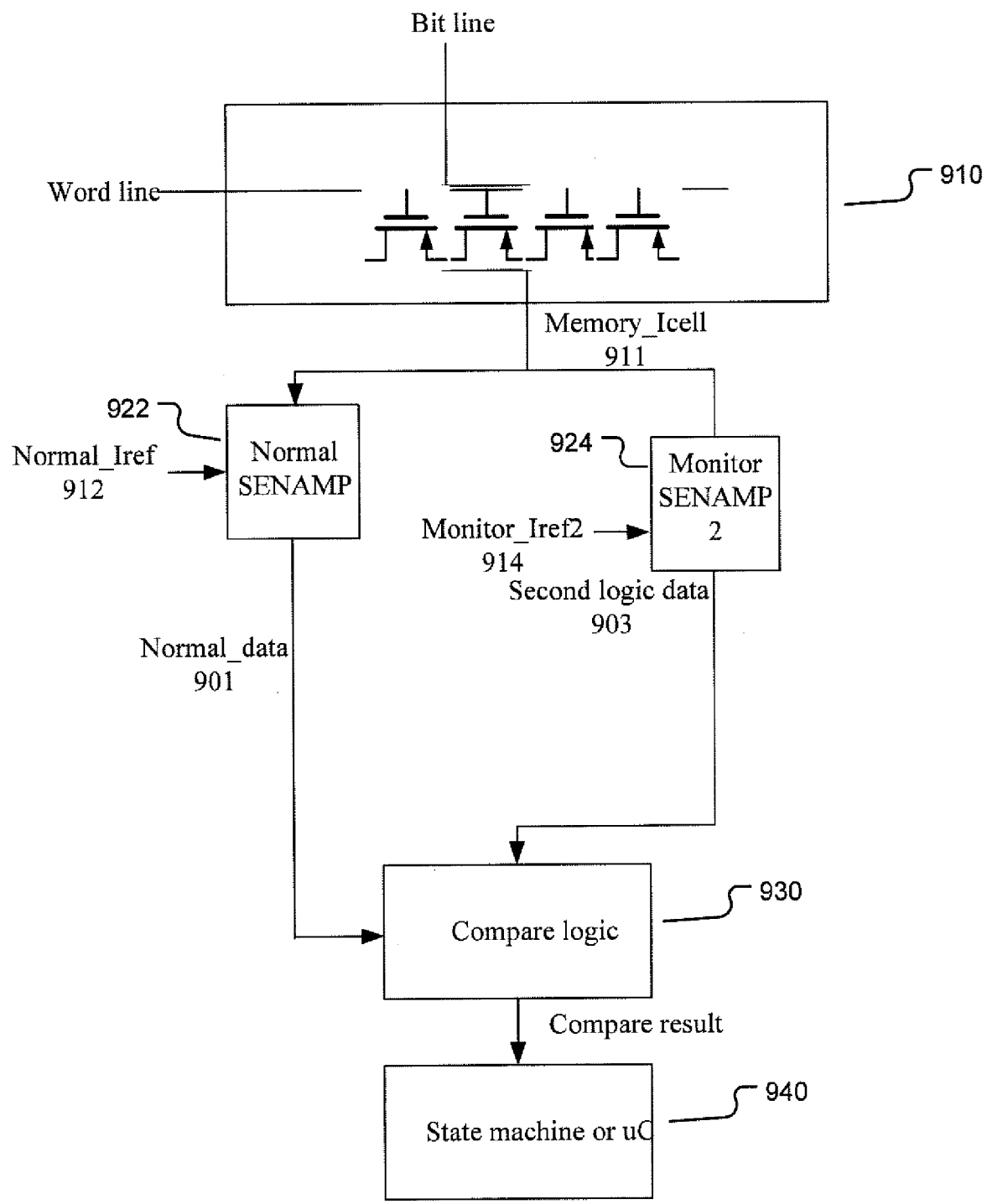
FIG. 9C shows a process flow of performing parallel sensing similar to FIG. 9A, but uses the second monitor reference current without using the first monitor reference current.

FIG. 9A shows a process flow of performing parallel sensing to determine whether to perform the refresh function. Data cells 910 are accessed via word lines and bit lines. A selected data cell from data cells 910 provides a measurement current memory_Icell 911 via a bit line. This measurement current memory_Icell 911 is sensed by the normal sense amplifier 922 using the normal_Iref 912 to get the normal_data 901; sensed by the monitor sense amplifier 923 using the monitor_Iref1 913 to get the first logic data 902; sensed by the monitor sense amplifier 924 using the monitor_Iref2 914 to get the second logic data 903. The first logic data 902 and the second logic data 903 are input to a data_MUX 925 and selected by normal_data 901. If the normal_data 901 is a high threshold voltage, then data_MUX 925 outputs first logic data 902 as input to compare logic 930. If the normal_data 901 is a low threshold voltage, then data_MUX 925 outputs second logic data 903 as input to compare logic 930. Compare logic block 930 also receives normal_data 901 as input. The normal sense amplifier 922 compares the memory_Icell 911 with the reference current normal_Iref 912, and generates the output normal_data 901. The monitor sense amplifier 1 923 compares the memory_Icell 911 with the monitor_Iref1 913, and generates the output first logic data 902. The monitor sense amplifier 2 924 compares the memory_Icell 911 with the monitor_Iref1 914, and generates the output second logic data 903. Based on the comparison by compare logic 930 of the normal_data 901 and the output of the data MUX 925, compare logic 930 outputs a match or a mismatch to the state machine or microcontroller 940, and the state machine or microcontroller 940 determines whether to refresh the selected data memory cell from data memory cells 910. FIG. 9B and FIG. 9.C respectively show using monitor_Iref1 but not monitor_Iref2, and using monitor_Iref2 but not monitor_Iref1. If only applying one monitor_Iref then the data_MUX 925 is unnecessary.

Figure 10A:
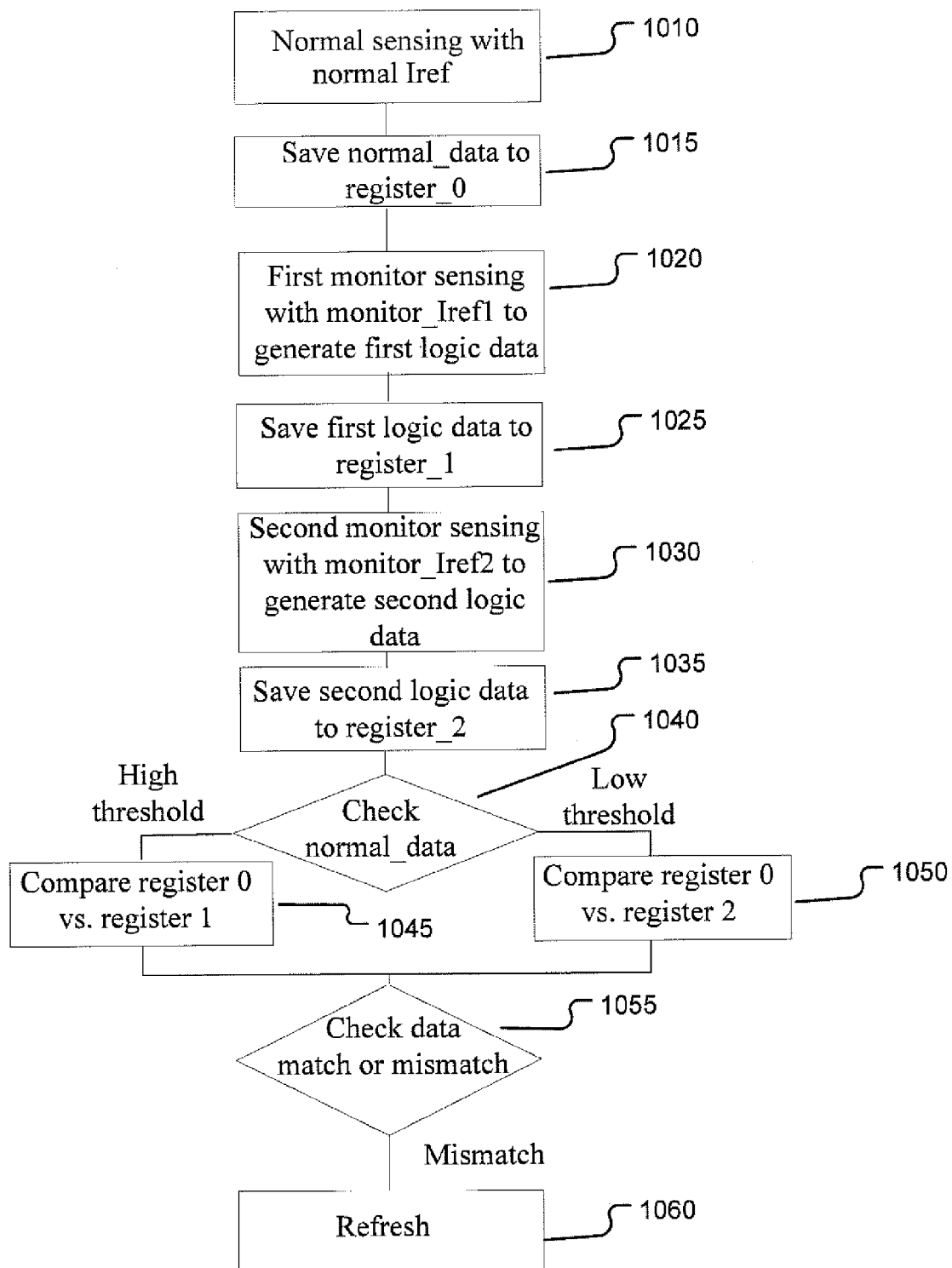
FIG. 10A shows a process flow of performing serial sensing with first and second monitor reference currents to determine whether to perform the refresh function with only a normal sense amplifier, that implements FIG. 8.
Figure 10B:
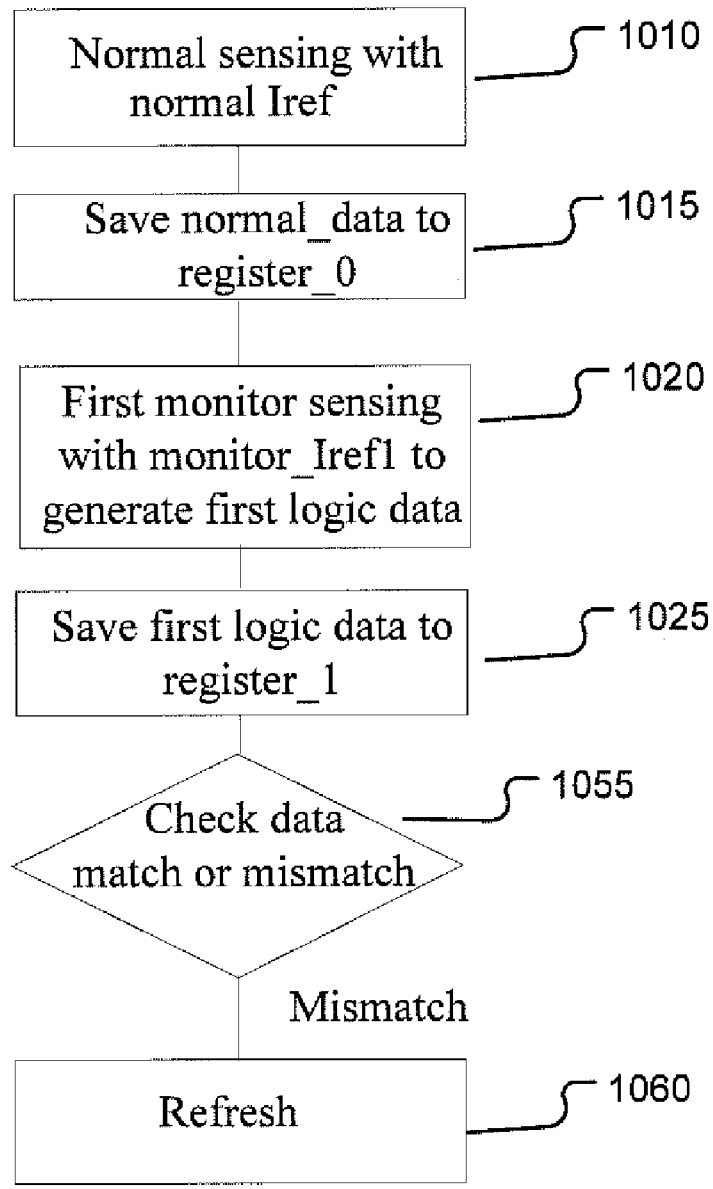
FIG. 10B shows a process flow of performing serial sensing similar to FIG. 10A, but using the first monitor reference current without using the second monitor reference current
Figure 10C:
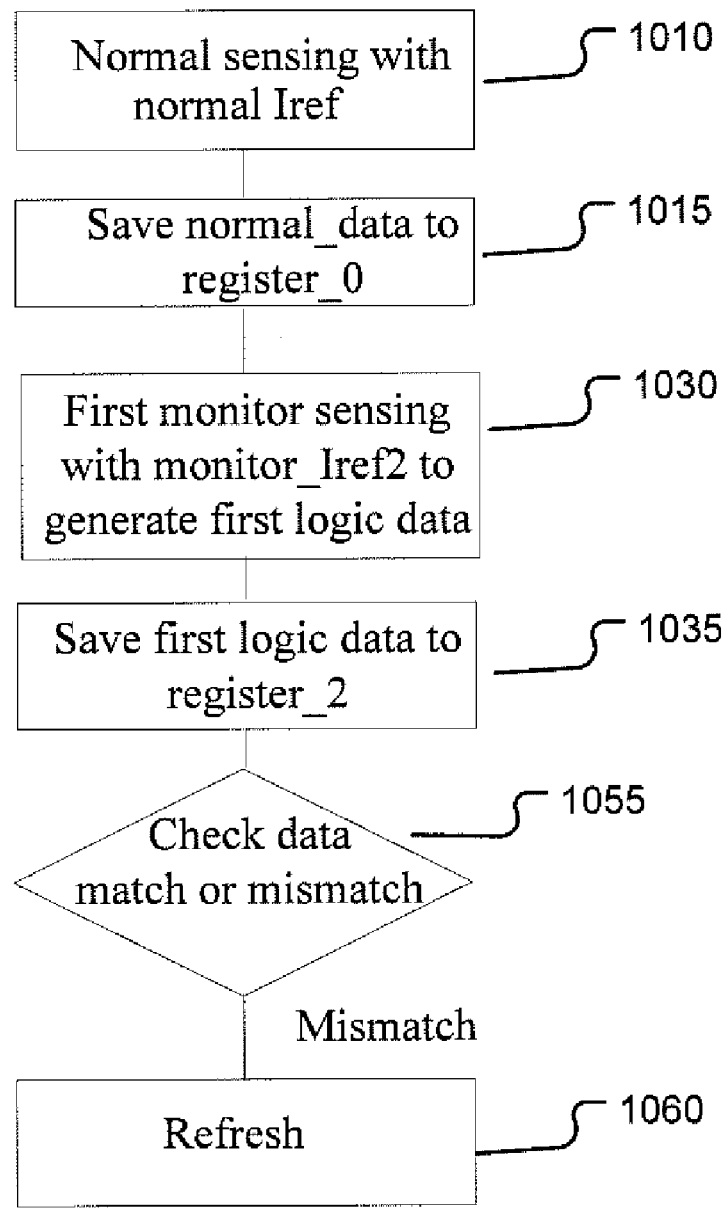
FIG. 10C shows a process flow of performing serial sensing similar to FIG. 10A, but using the second monitor reference current without using the second monitor reference current

FIG. 10A shows a process flow of performing serial sensing to determine whether to perform the refresh function. In serial sensing, the memory doesn't need the extra monitor sense amplifiers 923 and 924. Instead, the normal sense amplifier senses over multiple cycles with the different reference currents, normal_Iref, monitor_Iref1 and monitor I_ref2. This process flow is performed, for example, in a nonvolatile memory with the design of FIG. 8, but without the monitor sense amplifiers. In 1010, normal sensing is performed with the reference current normal_Iref based on nominal data memory operation to generate the sensed output normal_data. In 1015, save the normal_data to register_0. In 1020, first monitor sensing is performed with the monitor current monitor_Iref1 to generate the sensed output first logic data. In 1025, save the first logic data to register_1. In 1030, second monitor sensing is performed with the monitor current monitor_Iref2 to generate the sensed output second logic data. In 1035, save the second logic data to register_2. In 1040, check the normal_data if the normal_data is high threshold then compare register 0 VS register 1 1045; if the normal_data is low threshold then compare register 0 VS register 2 1050. In 1055, check the data is match or mismatch. In 1060, if the data is mismatch then refreshing. FIG. 10B and FIG. 10C respectively show the use of monitor_Iref1 without monitor_Iref2, and the use of monitor_Iref2 without monitor_Iref1. If only applying one monitor_Iref, then step 1040 is not used.

Figure 11:
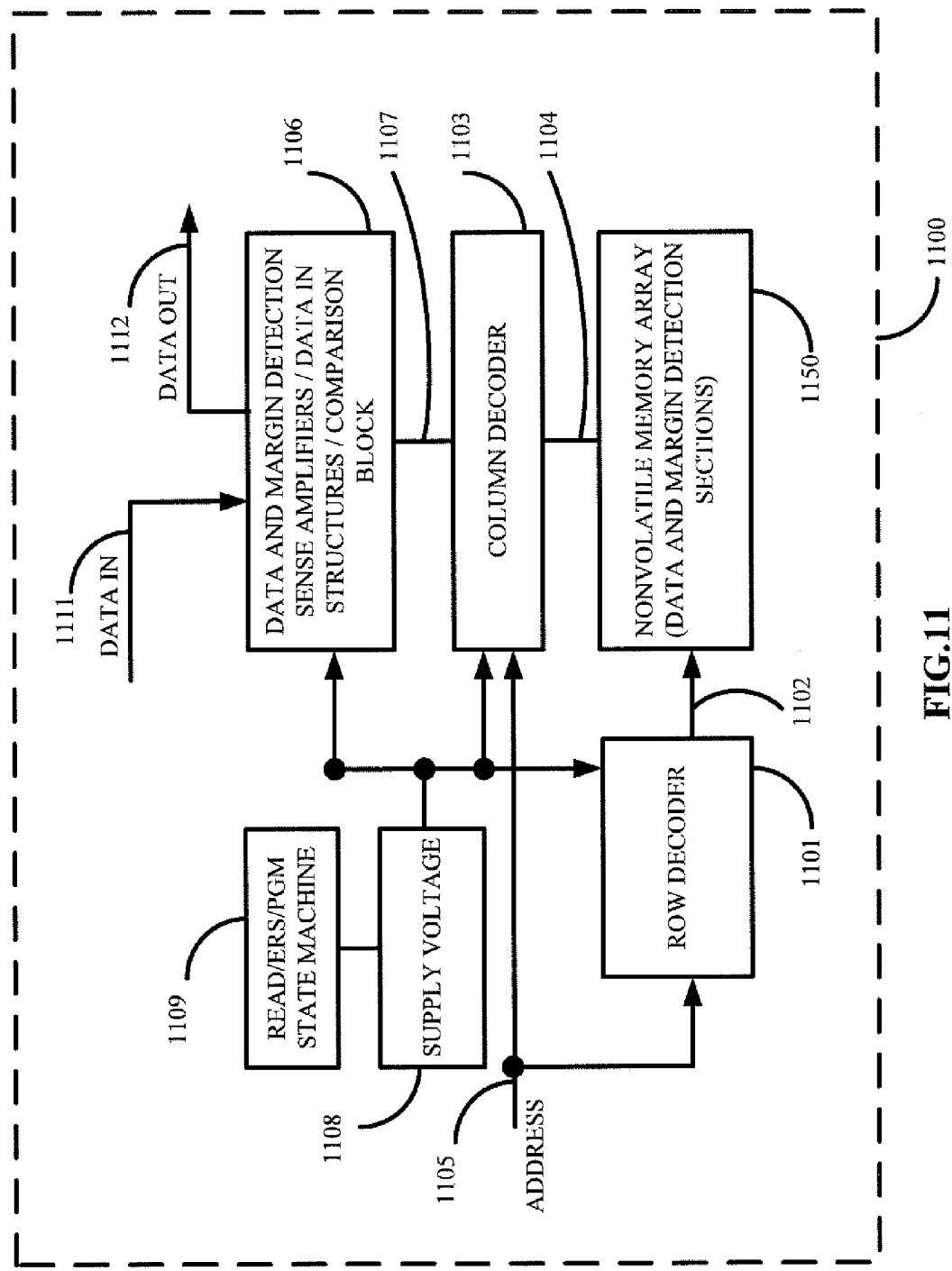
FIG. 11 shows a block diagram for performing parallel sensing to determine whether to perform the refresh function, with margin detection cells and a margin detection sense amplifier.

FIG. 11 is a simplified diagram of an integrated circuit with nonvolatile memory cells and the refresh circuitry. The integrated circuit 1100 includes a memory array 1150 implemented using data and margin detection sections of nonvolatile memory cells, on a semiconductor substrate. The memory cells of array 1150 may be individual cells, interconnected in arrays, or interconnected in multiple arrays. A row decoder 1101 is coupled to a plurality of word lines 1102 arranged along rows in the memory array 1150. A column decoder 1103 is coupled to a plurality of bit lines 1104 arranged along columns in the memory array 1150. Addresses are supplied on bus 1105 to column decoder 1103 and row decoder 1101. Data sense amplifier, margin detection sense amplifiers, data-in structures, and comparison block in block 1106 are coupled to the column decoder 1103 via data bus 1107. Data is supplied via the data-in line 1111 from input/output ports on the integrated circuit 1100, or from other data sources internal or external to the integrated circuit 1100, to the data-in structures in block 1106. Data is supplied via the data-out line 1115 from the sense amplifiers in block 1106 to input/output ports on the integrated circuit 1100, or to other data destinations internal or external to the integrated circuit 1100. A bias arrangement state machine 1109 controls the application of bias arrangement supply voltages 1108, such as for the erase verify and program verify voltages, and the arrangements for programming, erasing, and reading the memory cells.

Figure 12:
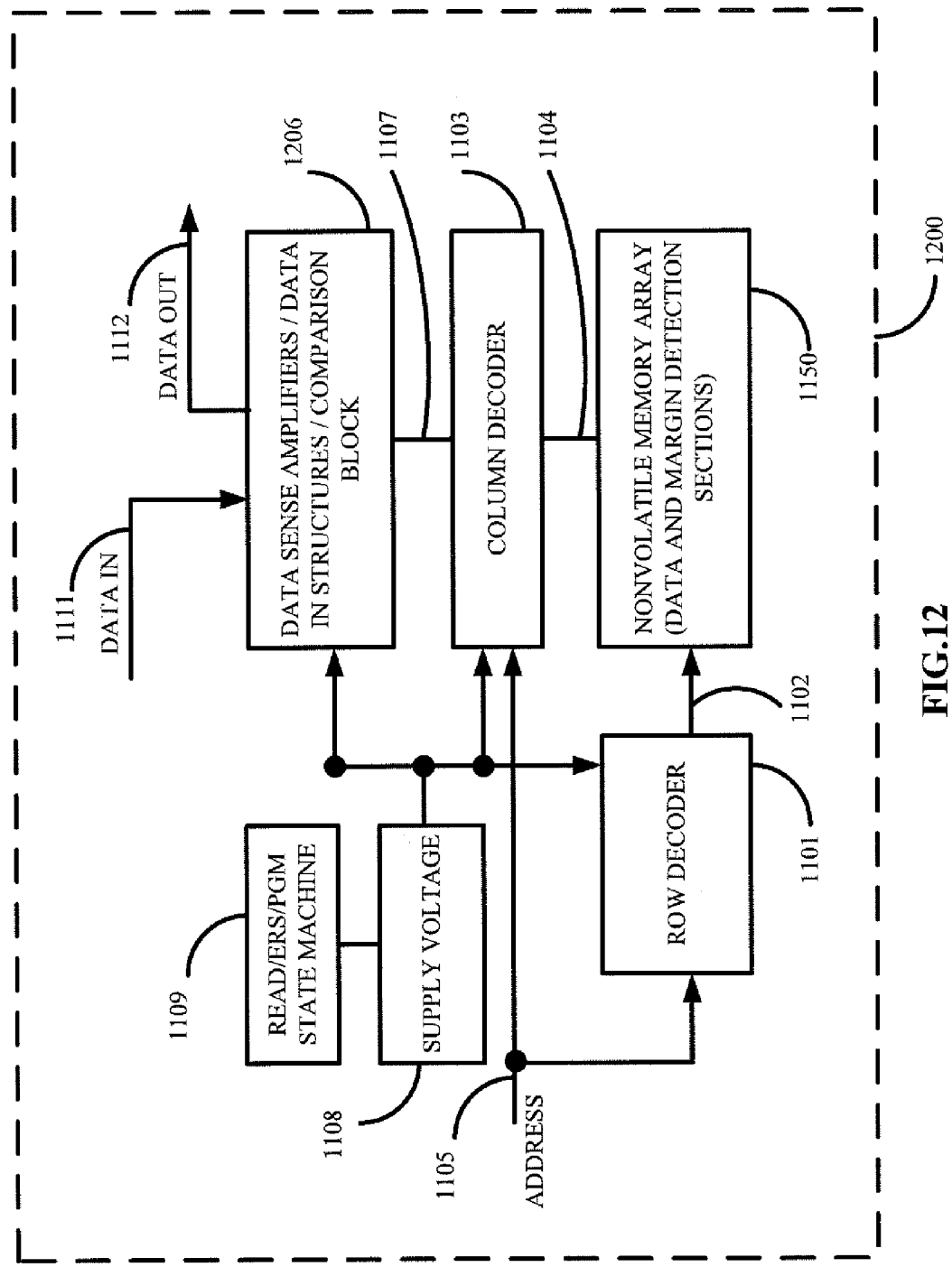
FIG. 12 shows a block diagram for performing serial sensing to determine whether to perform the refresh function, with margin detection cells.

FIG. 12 is a simplified diagram of an integrated circuit with nonvolatile memory cells and the refresh circuitry. The integrated circuit 1200 includes a memory array 1150 implemented using data and margin detection sections of nonvolatile memory cells, on a semiconductor substrate. The memory cells of array 1150 may be individual cells, interconnected in arrays, or interconnected in multiple arrays. Data sense amplifiers, comparison block, and data-in structures in block 1206 are coupled to the column decoder 1103 via data bus 1107. Data is supplied via the data-in line 1111 from input/output ports on the integrated circuit 1200, or from other data sources internal or external to the integrated circuit 1200, to the data-in structures in block 1206. Data is supplied via the data-out line 1115 from the block 1206 to input/output ports on the integrated circuit 1200, or to other data destinations internal or external to the integrated circuit 1200.

Figure 13:
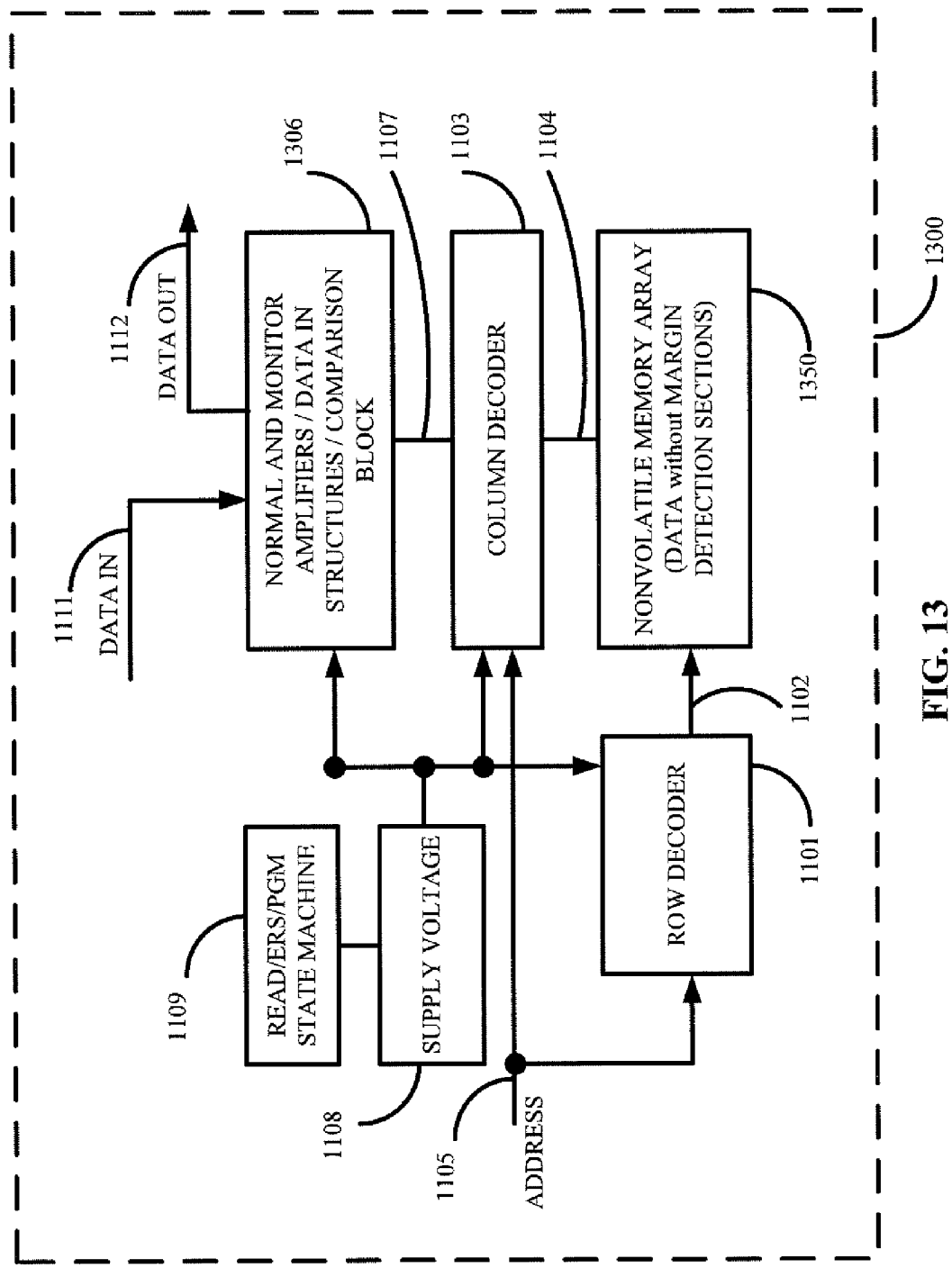
FIG. 13 shows a block diagram for performing parallel sensing to determine whether to perform the refresh function, with both a normal sense amplifier and a monitor sense amplifier. The normal sense amplifier senses with normal_Iref and the monitor sense amplifier senses with monitor_Iref.

FIG. 13 is a simplified diagram of an integrated circuit with nonvolatile memory cells and the refresh circuitry. The integrated circuit 1300 includes a memory array 1350 implemented using data memory cells on a semiconductor substrate. The memory cells of array 1350 may be individual cells, interconnected in arrays, or interconnected in multiple arrays. A row decoder 1101 is coupled to a plurality of word lines 1102 arranged along rows in the memory array 1350. A column decoder 1103 is coupled to a plurality of bit lines 1104 arranged along columns in the memory array 1350. Addresses are supplied on bus 1105 to column decoder 1103 and row decoder 1101. Normal sense amplifiers, monitor sense amplifiers, comparison block, and data-in structures in block 1306 are coupled to the column decoder 1103 via data bus 1107. Data is supplied via the data-in line 1111 from input/output ports on the integrated circuit 1300, or from other data sources internal or external to the integrated circuit 1300, to the data-in structures in block 1306. Data is supplied via the data-out line 1115 from the sense amplifiers in block 1306 to input/output ports on the integrated circuit 1300, or to other data destinations internal or external to the integrated circuit 1300.

Figure 14:
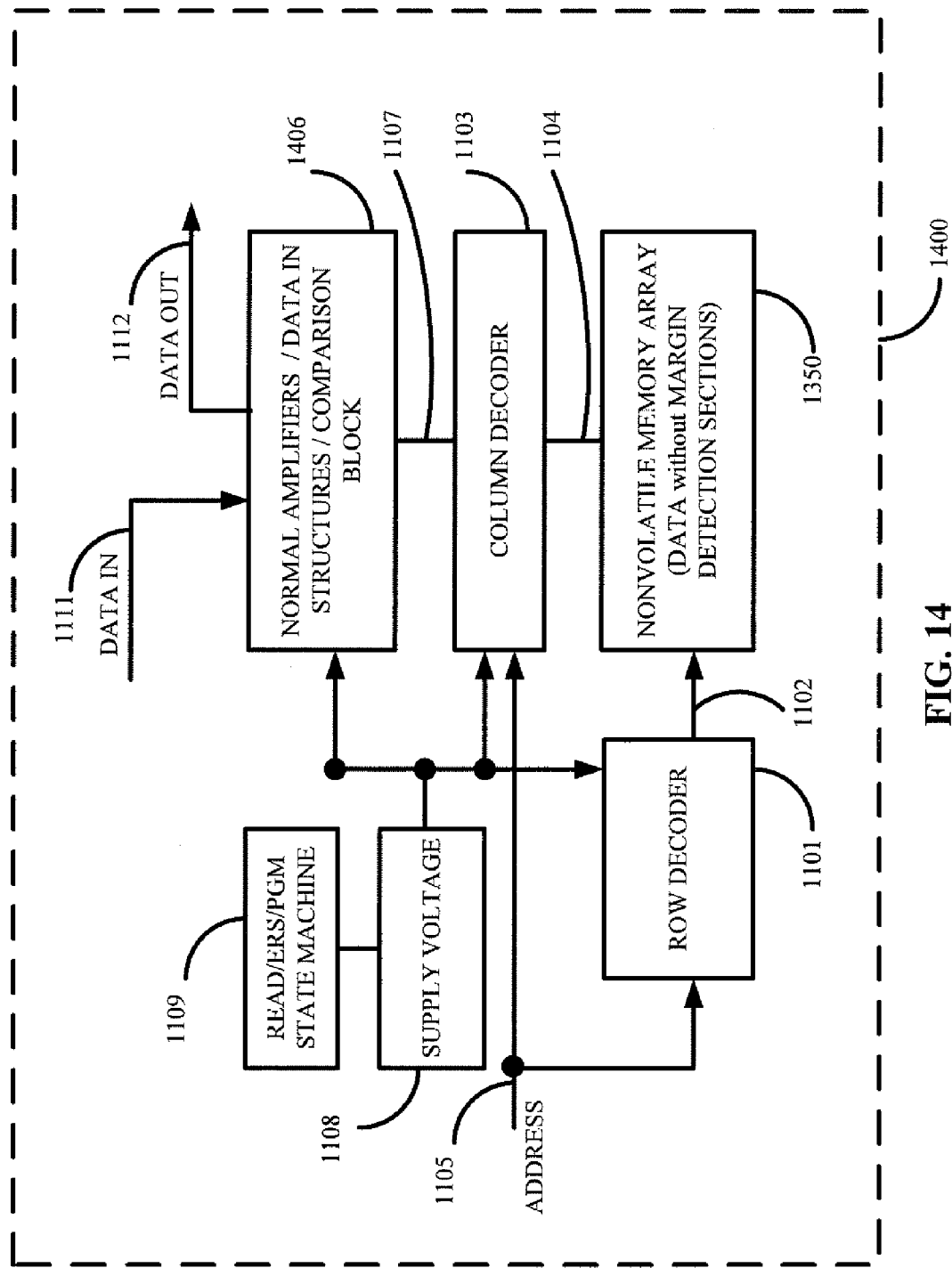
FIG. 14 shows a block diagram for performing serial sensing to determine whether to perform the refresh function, with a sense amplifier that senses with normal_Iref and monitor_Iref in different cycles.

FIG. 14 is a simplified diagram of an integrated circuit with nonvolatile memory cells and the refresh circuitry. The integrated circuit 1400 includes a memory array 1350 implemented using data memory cells on a semiconductor substrate. Addresses are supplied on bus 1005 to column decoder 1103 and row decoder 1101. Sense amplifiers, comparison block, and data-in structures in block 1406 are coupled to the column decoder 1103 via data bus 1107. Data is supplied via the data-in line 1111 from input/output ports on the integrated circuit 1400, or from other data sources internal or external to the integrated circuit 1400, to the data-in structures in block 1406. Data is supplied via the data-out line 1115 from the block 1406 to input/output ports on the integrated circuit 1400, or to other data destinations internal or external to the integrated circuit 1400.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory integrated circuit, comprising:
   nonvolatile memory cells, including:
   a plurality of data cells with a first operating margin, wherein the plurality of data cells are arranged into a plurality of data groups; and
   a plurality of margin detection cells with a second operating margin narrower than the first operating margin, the plurality of margin detection cells storing default data, wherein each data group of the plurality of data groups has at least one corresponding margin detection cell in the plurality of margin detection cells;
   one or more comparison memory cells storing the default data;
   one or more sets of sense amplifiers to sense the plurality of data cells and the plurality of margin detection cells; and
   control circuitry responding to a memory user mode command by applying bias arrangements to the plurality of data cells and the plurality of margin detection cells,
   wherein the bias arrangements are applied to: 1) at least one data cell of at least one data group of the plurality of data groups, 2) at least one corresponding margin detection cell of said at least one data group storing the default data, and 3) at least one of the comparison memory cells storing the default data, and
   wherein the control circuitry refreshes at least part of one or more data groups of the plurality of data groups, in response to a failure by said at least one corresponding margin detection cell to agree with said at least one of the comparison memory cells.

2. The circuit of claim 1, wherein said one or more sets of sense amplifiers includes a single set of sense amplifiers shared by the plurality of data cells and the plurality of margin detection cells.

3. The circuit of claim 1, wherein said one or more sets of sense amplifiers includes:
 a first set of sense amplifiers for the plurality of data cells; and
 a second set of sense amplifiers for the plurality of margin detection cells.

4. The circuit of claim 1, wherein the plurality of data groups is determined by word lines controlling particular nonvolatile memory cells.

5. The circuit of claim 1, wherein said failure is at least a threshold voltage of said one or more corresponding margin detection cells falling outside the second operating margin.

6. The circuit of claim 1, wherein the failure by said one or more corresponding margin detection cells is caused by at least charge loss from said one or more corresponding margin detection cells.

7. The circuit of claim 1, wherein the failure by said one or more corresponding margin detection cells is caused by at least charge gain in said one or more corresponding margin detection cells.

8. The circuit of claim 1, further comprising:
 an externally accessible contact of the integrated circuit having:
  an output state indicating that the integrated circuit is busy.

9. The circuit of claim 1, further comprising:
 a first externally accessible contact of the integrated circuit indicating at least whether the integrated circuit is busy determining a need to refresh; and
 a second externally accessible contact of the integrated circuit indicating at least whether the integrated circuit is ready for a new command or refreshing.

10. The circuit of claim 1, wherein the plurality of data cells has a charge loss margin of less than 0.7 V.

11. The circuit of claim 1, wherein the plurality of data cells has a charge loss margin of about 0.2 V.

12. The circuit of claim 1, wherein the plurality of data cells has a cycling margin of less than 0.4 V.

13. The circuit of claim 1, wherein the plurality of data cells are multi-level cells.

14. The circuit of claim 1, wherein the data cells have a first sensing window corresponding to the first operating margin, the margin detection cells have a second sensing window corresponding to the second operating margin, and the first sensing window and the second sensing window are determined by setting different targets of threshold voltage for the margin detection cells and the data cells.

15. The circuit of claim 14, wherein the sensing window of the margin detection cells includes 1) a first window between current representing a high threshold voltage cell and a sensing reference current and 2) a second window between current representing a low threshold voltage cell and the sensing reference current.

16. A method of operating nonvolatile memory, comprising:
 storing default data in: 1) a comparison memory and 2) at least one nonvolatile margin detection cell corresponding to at least one nonvolatile data cell, wherein said at least one nonvolatile data cell has a first operating margin and said at least one nonvolatile margin detection cell has a second operating margin narrower than the first operating margin;
 responsive to a memory user mode command, performing:
  applying bias arrangements to: 1) said at least one nonvolatile data cell, 2) said at least one nonvolatile margin detection cell;
  comparing the default data from the comparison memory and said at least one nonvolatile margin detection cell; and
  if the default data from the comparison memory fails to agree with the data from said at least one nonvolatile margin detection cell, then refreshing said at least one nonvolatile data cell.

17. The method of claim 16, wherein, responsive to the memory user mode command, said at least one nonvolatile data cell and said at least one nonvolatile margin detection cell are sensed in parallel with a data sense amplifier and a margin detection sense amplifier.

18. The method of claim 16, wherein, responsive to the memory user mode command, said at least one nonvolatile data cell and said at least one nonvolatile margin detection cell are sensed in series with a data sense amplifier.

* * * * *